(12) United States Patent
Tanaka

(10) Patent No.: US 7,779,373 B2
(45) Date of Patent: Aug. 17, 2010

(54) POSITION-DEPENDENT VARIATION AMOUNT COMPUTATION METHOD AND CIRCUIT ANALYSIS METHOD

(75) Inventor: Masakazu Tanaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 652 days.

(21) Appl. No.: 11/651,021

(22) Filed: Jan. 9, 2007

(65) Prior Publication Data

US 2007/0186196 A1 Aug. 9, 2007

(30) Foreign Application Priority Data

Feb. 7, 2006 (JP) ............... 2006-029729

(51) Int. Cl.
*G06F 17/50* (2006.01)
(52) U.S. Cl. ............................ 716/4; 716/18
(58) Field of Classification Search ............. 716/3–6
See application file for complete search history.

(56) References Cited

U.S. PATENT DOCUMENTS

| 6,622,289 | B2 * | 9/2003 | Saunders et al. ............... 716/4 |
| 7,089,525 | B2 * | 8/2006 | Tamaki et al. ................. 716/12 |
| 7,302,673 | B2 * | 11/2007 | Habitz et al. ................... 716/21 |
| 2002/0073388 | A1 | 6/2002 | Orshansky et al. | |
| 2004/0261044 | A1 | 12/2004 | Yonezawa | |
| 2006/0075379 | A1 | 4/2006 | Kamat | |

FOREIGN PATENT DOCUMENTS

JP 2002-279012 9/2002

* cited by examiner

*Primary Examiner*—Jack Chiang
*Assistant Examiner*—Binh C Tat
(74) *Attorney, Agent, or Firm*—McDermott Will & Emery LLP

(57) ABSTRACT

Using layout position information as input, in a position-dependent variation amount calculation step, position-dependent variation amount information which is a variation amount of a characteristic parameter or a shape parameter variable depending on an arrangement position of each element constituting a design target semiconductor integrated circuit is calculated. Thereafter, a simulation is performed using circuit information. In the simulation, a value for the circuit information is corrected according to a position-dependent variation amount of the position-dependent variation amount information, and a result of the simulation is calculated. Accordingly, a simulation for a circuit characteristic using a variation amount depending on an arrangement position of a device and the like can be performed with layout position information for a semiconductor integrated circuit.

21 Claims, 7 Drawing Sheets

POSITION-DEPENDENT VARIATION AMOUNT COMPUTATION METHOD AND CIRCUIT ANALYSIS METHOD

CROSS REFERENCE TO RELATED APPLICATIONS

This non-provisional application claims priority under 35 U.S.C. §119(a) on patent application No. 2006-029729 filed in Japan on Feb. 7, 2006, the entire contents of which are hereby incorporated by reference.

BACKGROUND OF THE INVENTION

The present invention relates to circuit designs for semiconductor integrated circuits, and more particularly relates to a technique for performing simulation of circuit characteristics on the basis of information for fabrication process.

In recent years, due to miniaturization of the fabrication process, influences of process variations on circuit characteristics have been increased in circuit design for semiconductor integrated circuits.

Conventionally, as a technique for a simulation of circuit characteristics, a technique in which shape parameters and the like for transistors constituting a semiconductor integrated circuit are intentionally distributed at random by the Monte Carlo simulation to estimate circuit characteristics for the semiconductor integrated circuit has been known.

Moreover, for example, Japanese Laid-Open Publication No. 2002-279012 discloses a technique in which circuit simulation of characteristics is performed by estimating, when timing analysis for a semiconductor integrated circuit is performed, a delay variation for a semiconductor integrated circuit at high speed with consideration of a delay variation for each logic cell constituting the semiconductor integrated circuit and the correlation between delay variations of the logic cells.

However, when the present inventor examined influences of process variations on circuit characteristics, it was found that shapes and characteristics of devices, interconnects and the like of a semiconductor integrated circuit are changed depending on positions of the elements and the like. In the simulations of circuit characteristics using the above-described known technique and the technique described in the Japanese Laid-Open Publication No. 2002-279012, circuit characteristics were not estimated with consideration of arrangement positions where elements of a semiconductor integrated circuit were arranged.

Moreover, when a plurality of parameters are intentionally distributed at random by the Monte Carlo simulation, an enormous calculation processing time is required.

SUMMARY OF THE INVENTION

It is therefore an object of the present invention to makes it possible to calculate a variation amount depending on change of a position of a device and the like using layout position information of a semiconductor integrated circuit and then perform a simulation for a circuit characteristic using the variation amount, and also to effectively perform the simulation without increasing a calculation processing time, compared to the known technique.

To achieve the above-described object, the present invention employs a method in which in a semiconductor integrated circuit, a simulation is performed by estimating a characteristic parameter or a shape parameter variable depending on an arrangement position of an element in the semiconductor integrated circuit with reference to layout position information of the semiconductor integrated circuit.

Specifically, a position-dependent variation amount computation method according to the present invention is characterized in that the position-dependent variation amount computation method is used when a characteristic parameter or a shape parameter of each element constituting a design target semiconductor integrated circuit is -estimated using computer, on-wafer or on-chip layout position information for the element of the semiconductor integrated circuit is received and then, based on the layout position information for the element, a position-dependent variation amount variable depending on an arrangement position of the element is calculated to estimate the characteristic parameter or the shape parameter of the element.

In one embodiment of the present invention, the position-dependent variation amount computation method is characterized in that the element is an interconnect, a device or a partial circuit.

In one embodiment of the present invention, the position-dependent variation amount computation method is characterized in that the arrangement position of the element is expressed by coordinates of a predetermined coordinate system.

In one embodiment of the present invention, the position-dependent variation amount computation method is characterized in that an origin and a direction of a coordinate axis in the predetermined coordinate system are determined, based on a random number.

In one embodiment of the present invention, the position-dependent variation amount computation method is characterized in that a computation position of the position-dependent variation amount is expressed by coordinates of a predetermined coordinate system.

In one embodiment of the present invention, the position-dependent variation amount computation method is characterized by including: a position topology calculation step for calculating a position topology of an element to be calculated; and a position topology dependent variation calculation step for calculating, based on the position topology, a position-dependent variation amount of the element.

In one embodiment of the present invention, the position-dependent variation amount computation method is characterized in that in the position topology calculation step, the position topology is calculated using a predetermined position topology calculation equation.

In one embodiment of the present invention, the position-dependent variation amount computation method is characterized in that in the position topology calculation step, the position topology is calculated using a position topology calculation equation providing a worst case for a circuit characteristic of the design target semiconductor integrated circuit.

In one embodiment of the present invention, the position-dependent variation amount computation method is characterized in that in the position topology calculation step, the position topology is calculated, based on a random number.

In one embodiment of the present invention, the position-dependent variation amount computation method is characterized in that in the position topology calculation step, the position topology is calculated using a position topology calculation equation set, based on fabrication process information for the semiconductor integrated circuit.

In one embodiment of the present invention, the position-dependent variation amount computation method is characterized in that the position topology calculation equation is determined according to any one of an ion injection direction, a light exposure direction, a polishing direction, a cleansing direction and a deposition direction in fabrication process.

In one embodiment of the present invention, the position-dependent variation amount computation method is characterized in that the position-dependent variation amount is calculated, based on a position topology variable depending on an arrangement position of the element, and the position topology exhibits periodicity in each partial layout of the semiconductor integrated circuit.

In one embodiment of the present invention, the position-dependent variation amount computation method is characterized in that the periodicity of the partial layout is repeated in a coordinate axis direction of a Cartesian coordinate system.

In one embodiment of the present invention, the position-dependent variation amount computation method is characterized in that the periodicity of the partial layout is repeated in a rotation direction of a polar coordinate system.

In one embodiment of the present invention, the position-dependent variation amount computation method is characterized in that a shape of the partial layout and a periodic condition for the periodicity are determined, based on fabrication process information.

In one embodiment of the present invention, the position-dependent variation amount computation method is characterized in that the shape of the partial layout and the periodic condition for the periodicity are determined according to any one of an ion injection region, a light exposure region, a polishing region, a cleansing region and a deposition region in the fabrication process.

In one embodiment of the present invention, the position-dependent variation amount computation method is characterized in that the fabrication process information is a rotation angle in a predetermined process step in the fabrication process.

In one embodiment of the present invention, the position-dependent variation amount computation method is characterized in that the rotation angle in the predetermined process step in any one of an ion injection step, a light exposure step, a polishing step, a cleansing step, and a deposition step in the fabrication process.

In one embodiment of the present invention, the position-dependent variation amount computation method is characterized in that the position-dependent variation amount is a variation amount of the characteristic parameter or the shape parameter of the element due to a process variation.

In one embodiment of the present invention, the position-dependent variation amount computation method is characterized in that the position-dependent variation amount is a mean value of a distribution function for a process variation.

In one embodiment of the present invention, the position-dependent variation amount computation method is characterized in that the element is an interconnect, a device or a partial circuit, and the position-dependent variation amount is a variation amount of any one of respective shape parameters for the device and the interconnect and respective characteristic parameters for a threshold voltage, an oxide film thickness, a resistance value and a capacitance value of the device.

In one embodiment of the present invention, the position-dependent variation amount computation method is characterized in that the position-dependent variation amount is calculated, based on a position topology variable depending on an arrangement position of the element.

In one embodiment of the present invention, the position-dependent variation amount computation method is characterized in that the position-dependent variation amount is calculated according to a predetermined position-dependent variation amount equation.

A circuit analysis method according to the present invention is characterized in that the circuit analysis method is a method for analyzing a circuit characteristic of a design target semiconductor integrated circuit, a position-dependent variation amount variable depending on an arrangement position of each element constituting the semiconductor integrated circuit is calculated, and a simulation for the semiconductor integrated circuit is performed using the position-dependent variation amount.

In one embodiment of the present invention, the circuit analysis method is characterized in that a predetermined value is calculated in advance for the position-dependent variation amount.

In one embodiment of the present invention, the circuit analysis method is characterized in that the position-dependent variation amount is a position-dependent variation amount providing a worst case for a circuit characteristic of the design target semiconductor integrated circuit.

In one embodiment of the present invention, the circuit analysis method is characterized in that the position-dependent variation amount is expressed by a predetermined distribution function.

In one embodiment of the present invention, the circuit analysis method is characterized in that a simulation for the semiconductor integrated circuit is performed using a random number.

In one embodiment of the present invention, the circuit analysis method is characterized in that a simulation for the semiconductor integrated circuit is performed using the position-dependent variation amount variable depending on the arrangement position of the element and distribution information which is independent from the arrangement position of the element.

A circuit analysis method according to the present invention is characterized in that the method is a circuit analysis method for analyzing a characteristic of a design target semiconductor integrated circuit using the above-described, position-dependent variation amount computation method, and a simulation for the semiconductor integrated circuit is performed using the position-dependent variation amount of the element of the semiconductor integrated circuit calculated according to the position-dependent variation amount computation method.

In one embodiment of the present invention, the circuit analysis method is characterized in that a simulation for the semiconductor integrated circuit is performed using a random number.

As has been described, according to the present invention, a characteristic parameter or a shape parameter variable depending on an arrangement position of each element in a semiconductor integrated circuit can be reliably estimated, based on layout position information, and a simulation for a circuit characteristic without random variations can be performed.

DESCRIPTION OF THE PREFERRED EMBODIMENTS

Hereafter, each of preferred embodiments of the present invention will be described with reference to the accompanying drawings.

<Position-Dependent Variation Amount Computation Method>

First Embodiment

Figure 1:
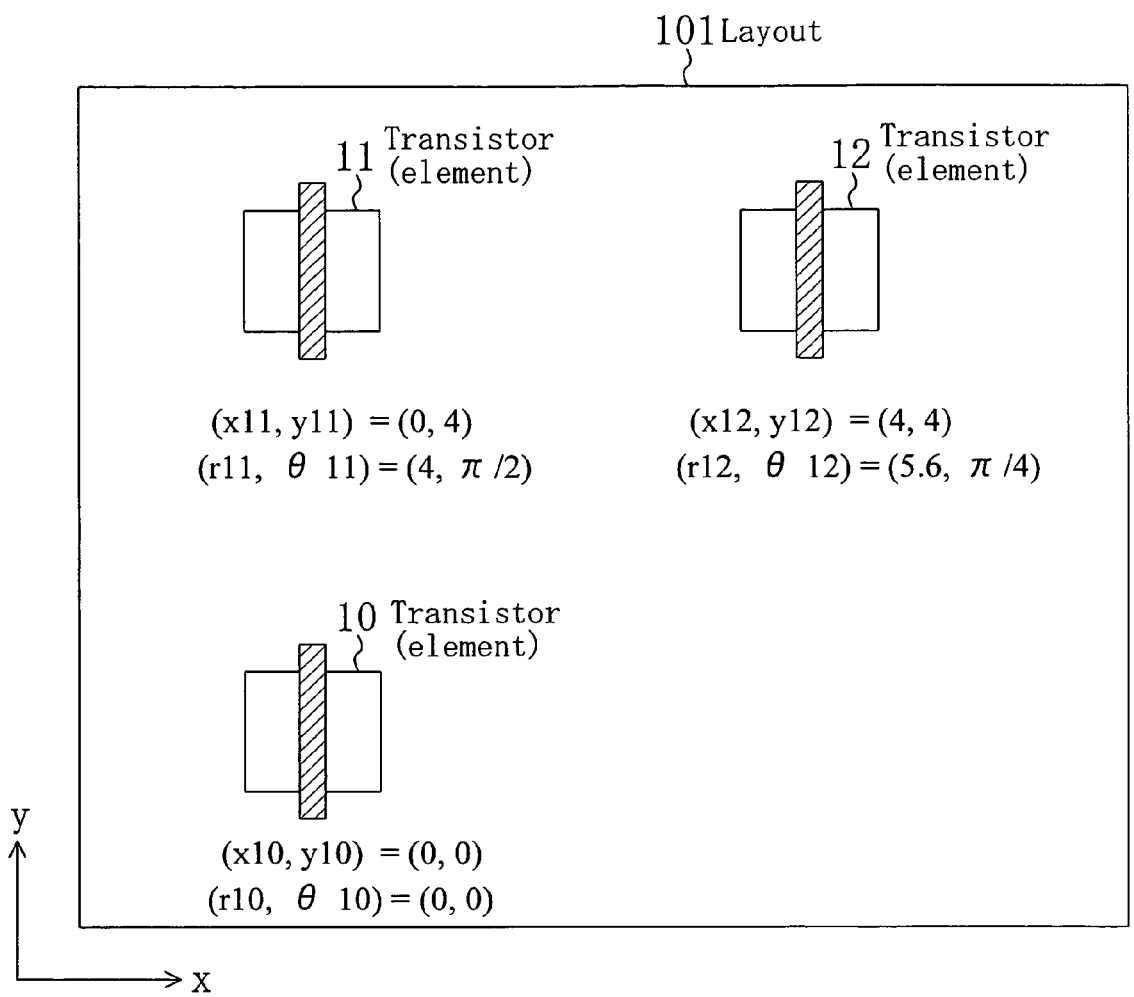
FIG. 1 is a diagram illustrating layout position information for each element in a semiconductor integrated circuit according to an embodiment of the present invention.

FIG. 1 is a diagram illustrating layout position information for each element in a semiconductor integrated circuit according to an embodiment of the present invention.

In FIG. 1, the reference numeral 101 denotes a layout of a semiconductor integrated circuit. FIG. 1 shows on-wafer or on-chip layout position information for each element constituting the semiconductor integrated circuit. In FIG. 1, as elements constituting the semiconductor integrated circuit, three transistors 10, 11 and 12 are arranged. Assume that respective arrangement positions of the transistors 10, 11 and 12 are expressed by positional coordinates of a Catesian coordinate system. Positional coordinates (x10, y10) of the transistor 10 are (0, 0), positional coordinates (x11, y11) of the transistor 11 are (0, 4) and positional coordinates (x12, y12) of the transistor 12 are (4, 4). Except for arrangement position, conditions for the three transistors 10, 11 and 12 are the same. For example, the transistors 10, 11 and 12 have the same shape.

In a coordinate system, an origin and the direction of a coordinate axis are determined by random numbers. In FIG. 1, the origin is set to be in the same position as the arrangement position of the transistor 10, the x axis extends in the lateral direction and the y axis extends in the longitudinal direction in FIG. 1.

Each element constituting the semiconductor integrated circuit does not have to be a transistor, but may be an interconnect or a partial circuit.

Figure 2:
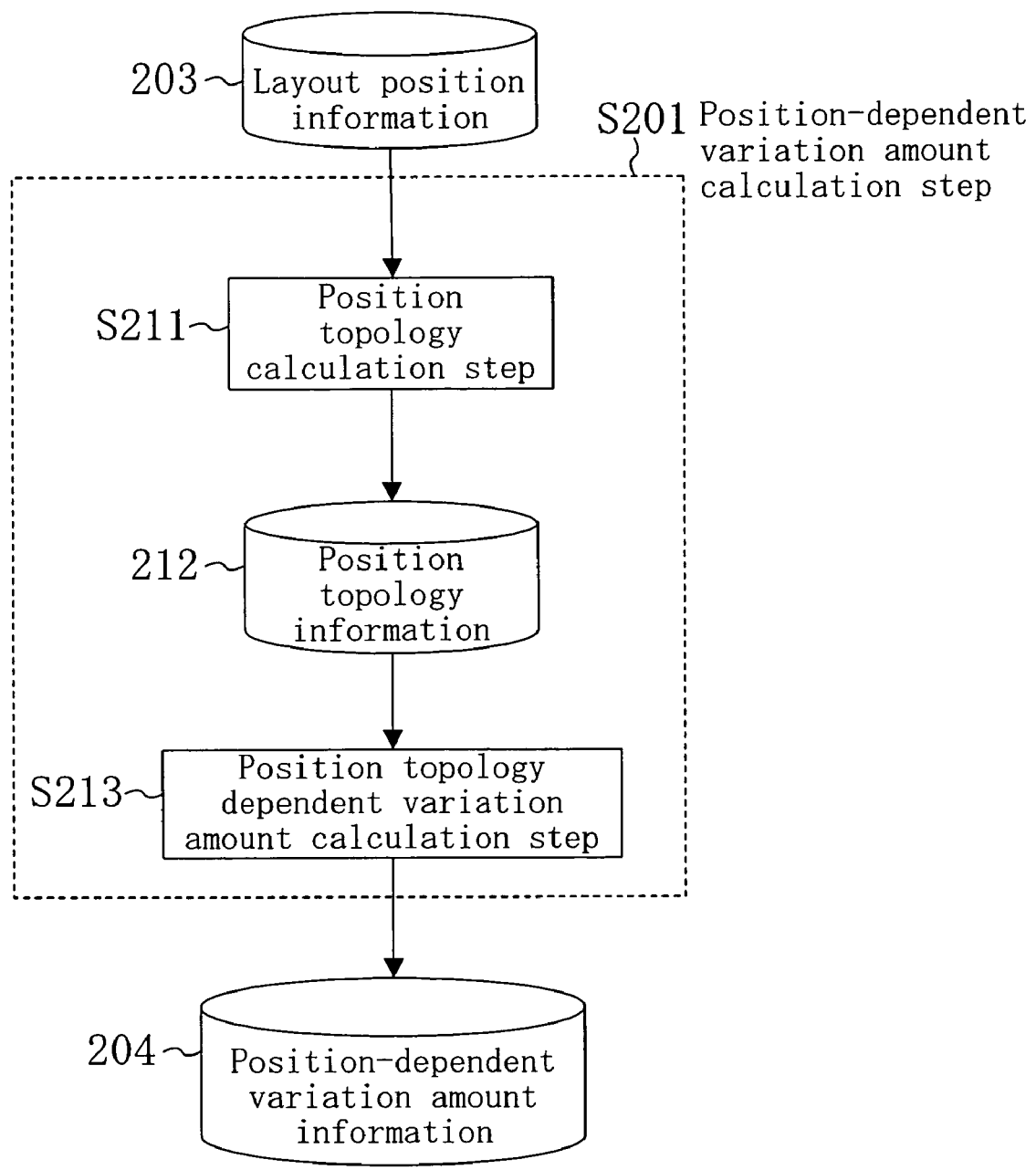
FIG. 2 is a flowchart of position-dependent variation amount calculation processing according to the present invention.

FIG. 2 is a flowchart of position-dependent variation amount calculation processing according to an embodiment of the present invention.

As shown in FIG. 2, in a position topology calculation step S211, using layout position information 203, which is, for example, information shown in FIG. 1, as an input, a position topology of each element constituting the semiconductor integrated circuit is calculated and then position topology information 212 including the position topology of each element is calculated. Thereafter, in a position-topology-dependent variation amount calculation step S213, a position-dependent variation amount for each element is calculated to obtain position-dependent variation amount information 204 from the position-dependent variation amount of each element.

The position topology calculation step S211 and the position topology-dependent variation amount calculation step S213 constitute a position-dependent variation amount calculation step S201. In the position-dependent variation amount calculation step S201, using the layout position information 203 as an input, the position-dependent variation amount information 204 is obtained. In the position-dependent variation amount calculation step S201, a position topology Z which is a variation coefficient of a characteristic parameter or a shape parameter variable depending on an arrangement position of each element and a position-dependent variation amount V which is an amount of change of the characteristic parameter or the shape parameter due to process variations are calculated by computer from position coordinates (x, y) of each element. A position topology calculation equation used for calculations of the position topology Z and a position-dependent variation amount calculation equation used for calculation of the position-dependent variation amount V are modeled according to the following Equation 1 and Equation 2 (where a, b, c, $\alpha$ and $\beta$ are constants). A predetermined calculation equations is set as each of the position topology calculation equation and the position-dependent variation amount calculation equation in advance.

$$Z = f1(x, y) = ax + by + c \quad \text{[Equation 1]}$$

$$V(Z) = \alpha + \beta Z \quad \text{[Equation 2]}$$

Each of the Equation 1 and Equation 2 is a linear function, but may be defined by an arbitrary function such as a quadratic function and the like.

Moreover, the respective arrangement positions of the transistors 10, 11 and 12 are expressed by positional coordinates of the Cartesian coordinate system, but can be expressed, assuming that $x = r \cdot \cos \theta$ and $y = r \cdot \sin \theta$ hold, by rotational coordinates (r, $\theta$) corresponding to a polar coordinate system. If the transistors 10, 11 and 12 are expressed in terms of the rotational coordinates (r, $\theta$), rotational coordinates (r10, $\theta$10) of the transistor 10 are (0, 0), rotational coordinates (r11, $\theta$11) of the transistor 11 are (4, $\pi$/2) and rotational coordinates (r12, $\theta$12) of the transistor 12 are (5.6, $\pi$/4).

In this case, a position topology calculation equation used for calculation of the position topology Z from the rotational coordinates (r, $\theta$) of each element is modeled according to the following Equation 3 (where d and e are constants).

$$Z = f2(r, \theta) = d\, r \cos(\theta - e) \quad \text{[Equation 3]}$$

The following Table 1 and Table 2 shows examples for shape parameters and characteristic parameters which are targets for calculation of the position-dependent variation amount V.

TABLE 1

| Elements | Shape parameters |
|---|---|
| Transistor | oxide film thickness, gate length, gate width, etc. |
| Resistor | resistor width, resistor length, resistor layer film thickness, etc. |
| Capacitor | width, length, capacitor layer film thickness, etc. |
| Interconnect | interconnect width, interconnect film thickness, interconnect separation width, etc. |

TABLE 2

| Elements | Characteristic parameters |
| --- | --- |
| Transistor | threshold voltage, gm, drain current, etc. |
| Resistor | resistance value, parasitic capacitance, parasitic resistance, etc. |
| Capacitor | capacitance, parasitic capacitance, parasitic resistance, etc. |
| Interconnect | interconnect resistance, interconnect capacitance, etc. |
| Partial circuit | delay, power consumption, current amount, etc. |

A position-dependent variation amount computation method according to a first embodiment of the present invention will be hereafter described.

In this embodiment, a dimension difference $\Delta W$ (which will be herein after a gate width dimension difference) between a design dimension and a finished dimension for a gate width W of a transistor. In this case, the gate width dimension difference $\Delta W$ is a position-dependent variation amount.

First, in the position topology calculation step S211, when a position topology Z of a transistor is defined by the following Equation 4, a position topology Z11 of the transistor 11 and a position topology Z12 of the transistor 12 are calculated according to the following Equation 5 and Equation 6.

$$Z = r\cos(\theta - \pi/4) \quad \text{[Equation 4]}$$

$$Z11 = r\cos(\theta - \pi/4) = 4.0\cos(\pi/2 - \pi/4) = 2.8 \quad \text{[Equation 5]}$$

$$Z12 = r\cos(\theta - \pi/4) = 5.6\cos(\pi/4 - \pi/4) = 5.6 \quad \text{[Equation 6]}$$

Thereafter, in the position topology dependent variation amount calculation step S213, when the gate width dimension difference $\Delta W$ which is a position-dependent variation amount is defined by the following Equation 7 using the position topology Z, the gate width dimension difference $\Delta W11$ of the transistor 11 of FIG. 1 and the gate width dimension difference $\Delta W12$ of the transistor 12 of FIG. 1 are calculated according to the following Equation 8 and Equation 9.

$$\Delta W = 0.3 + 0.01Z \quad \text{[Equation 7]}$$

$$\Delta W11 = 0.3 + 0.01 Z11 = 0.3 + 0.01 \cdot 2.8 = 0.328 \quad \text{[Equation 8]}$$

$$\Delta W12 = 0.3 + 0.01 Z12 = 0.3 + 0.01 \cdot 5.6 = 0.356 \quad \text{[Equation 9]}$$

In the description above, Equation 7 is used as the position-dependent variation amount calculation equation. However, when a characteristic parameter or a shape parameter is varied at random due to process variations, a center value or a mean value of variations can be used as a position-dependent variation amount. Moreover, when a center of variations varies depending on an arrangement position of an element of the semiconductor integrated circuit, the position dependency of the center can be calculated. Furthermore, when a variation amount of a characteristic parameter or a shape parameter varies depending on an arrangement position of an element of the semiconductor integrated circuit, the variation amount can be expressed by a position topology. In this case, the variation amount can be expressed by a dispersion and a standard deviation.

Moreover, when variations for an element in the semiconductor integrated circuit include both of a component dependent on a position of element and a component (i.e., a randomly varied component) independent on the position, only the component dependent on the position can be expressed by a position-dependent variation amount.

Furthermore, in the position topology calculation equation of Equation 4, the position topology Z may be calculated with random numbers.

In this case, with use of positional coordinates (x, y), an arrangement position of each element constituting the semiconductor integrated circuit can be expressed by an arbitrary position topology calculation equation. When the position topology calculation equation has a certain rotation direction, the arrangement position can be more easily expressed by using rotational coordinates (r, $\theta$).

Second Embodiment

A position-dependent variation amount computation method according to a second embodiment of the present invention will be described.

In this embodiment, the case where the gate width dimension difference $\Delta W$ for a gate width of a transistor has a distribution characteristic with a mean $\mu w$ and a standard deviation $\mu w$ will be described. In this case, each of a mean $\sigma w$ and a standard deviation $\sigma w$ of process variations for the gate width dimension difference $\Delta W$ is a position-dependent variation amount.

The mean $\mu w$ and the standard deviation $\sigma w$ of process variations for the gate width dimension difference $\Delta W$ of a transistor are calculated using a position topology Zm and a position topology Zs, according to the following Equation 10 and Equation 11. The position topologies Zm and Zs are defined by the following Equation 12 and Equation 13, respectively.

$$\mu w = 0.3 + 0.01 Zm \quad \text{[Equation 10]}$$

$$\sigma w = 0.01 + 0.01 Zs \quad \text{[Equation 11]}$$

$$Zm = r\cos(\theta - \pi/4) \quad \text{[Equation 12]}$$

$$Zs = r\cos(\theta - \pi/2) \quad \text{[Equation 13]}$$

In a position topology calculation step S211 of FIG. 2, the position topology Zm of the mean $\mu w$ and the position topology Zs of the standard deviation standard deviation $\sigma w$ which are the position topology information 212 of the transistor 11 are calculated from the rotational coordinates of the transistor 11 of the layout position information 203 shown in FIG. 1, according to the following Equation 14 and Equation 15.

$$Zm = r\cos(\theta - \pi/4) = 4.0\cos(\pi/2 - \pi 4) = 2.8 \quad \text{[Equation 14]}$$

$$Zs = r\cos(\theta - \pi/2) = 4.0\cos(\pi/2 - \pi/2) = 4.0 \quad \text{[Equation 15]}$$

Thereafter, in the position topology dependent variation amount calculation step S213, using the position topology Zm and the position topology Zs, the position dependent variation amount information 204 for the transistor 11, i.e., the mean $\mu w$ and the standard deviation $\sigma w$ of process variations of the gate width dimension difference $\Delta W$ is calculated according to the following Equation 16 and Equation 17.

$$\mu w = 0.3 + 0.01 Zm = 0.3 + 0.01 \cdot 2.8 = 0.328 \quad \text{[Equation 16]}$$

$$\sigma w = 0.01 + 0.001 Zs = 0.01 + 0.01 \cdot 4.0 = 0.05 \quad \text{[Equation 17]}$$

In this embodiment, as shown in Equation 16 and Equation 17, the gate width dimension difference $\Delta W$ for the transistor 11 can be expressed by a distribution function having distribution characteristics with a mean of 0.328 and a standard deviation of 0.05. Therefore, a center value and a variation amount of process variations for the shape parameter or the characteristic parameter variable depending on an arrangement position of each element of the semiconductor integrated circuit can be estimated.

Third Embodiment

A position-dependent variation amount computation method according to a third embodiment of the present invention will be described.

In this embodiment, it is assumed that where d=1 holds in Equation 3, a maximum value of a position-dependent variation amount according to a distance between two transistors of a semiconductor integrated circuit is known but a value e indicating the direction of a position-dependent variation is unknown. A method for calculating a maximum value max($\Delta W11-\Delta W12$) of a variation amount difference between the gate width dimension differences $\Delta W11$ and $\Delta W12$ of the two transistors 11 and 12 of FIG. 1 under the above-described condition, i.e., position topology calculation and position-dependent variation amount calculation in a worst case for circuit characteristics of the semiconductor integrated circuit will be described.

When a gate width dimension difference $\Delta W$ of a transistor has a variation amount of 0.01 per unit distance, a position topology Z is defined by the following Equation 18 and the gate width dimension difference $\Delta W$ which is the position-dependent variation amount information 204 for the transistor is defined by the following Equation 19.

$$Z = r\cos(\theta - e) \quad \text{[Equation 18]}$$

$$\Delta W = 0.3 + 0.01Z = 0.3 + 0.01r\cos(\theta - e) \quad \text{[Equation 19]}$$

Based on Equation 18 and Equation 19, the gate width dimension difference $\Delta W11$ of the transistor 11 and the gate width dimension difference $\Delta W12$ of the transistor 12 can be calculated according to Equation 20 and Equation 21.

$$\begin{aligned}\Delta W11 &= 0.3 + 0.01 r11 \cos(\theta 11 - e) \\ &= 0.3 + 0.04 \cos(\pi/2 - e)\end{aligned} \quad \text{[Equation 20]}$$

$$\begin{aligned}\Delta W11 &= 0.3 + 0.01 r12 \cos(\theta 12 - e) \\ &= 0.3 + 0.056 \cos(\pi/4 - e)\end{aligned} \quad \text{[Equation 21]}$$

Based on Equation 20 and Equation 21, the variation amount difference $\Delta W1-\Delta W12$ for the gate width dimension differences $\Delta W11$ and $\Delta W12$ of the two transistors 11 and 12 can be expressed by the following Equation 22 with use of an additional theorem for trigonometric functions.

$$\begin{aligned}\Delta W11 - \Delta W12 &= 0.04\cos(\pi/2 - e) - \\ &\quad 0.056\cos(\pi/4 - e) \\ &= -0.04\cos(e)\end{aligned} \quad \text{[Equation 22]}$$

In Equation 22, as shown in Equation 23, the maximum value max($\Delta W11-\Delta W12$) of the variation amount difference $\Delta W11-\Delta W12$ can be calculated with e=0 or e=$\pi$.

$$\max(\Delta W11-\Delta W12) = |-0.04\cos(e)| = 0.04 \quad \text{[Equation 23]}$$

Assume that this embodiment corresponds to the position-dependent variation amount calculation process flow of FIG. 2. First, in the position topology calculation step S211, the position topology information 212 including the position topologies Z11 and Z12 of the transistors 11 and 12 is calculated from the layout position information 203 using the position topology calculation equation giving a worst case for circuit characteristics, i.e., Equation 18 where e=0 or e=$\pi$.

Next, in the position topology dependent variation amount calculation step S213, using the position topology information 212 as an input, calculations are performed according to Equation 20 and Equation 21 to obtain the position dependent variation amount information 204 giving a worst case for circuit characteristics. Thereafter, using Equation 23, the maximum value max($\Delta W11-\Delta W12$) of a variation amount difference between the gate width dimension differences of the two transistors 11 and 12 is obtained.

As has been described, according to this embodiment, when a maximum variation amount per unit distance for a position-dependent variation amount is known, a maximum value of a variation amount difference between two elements in a semiconductor integrated circuit can be calculated by designating the direction of a tilt for a variation.

Fourth Embodiment

A position-dependent variation amount computation method according to a fourth embodiment of the present invention will be described.

Figure 3:
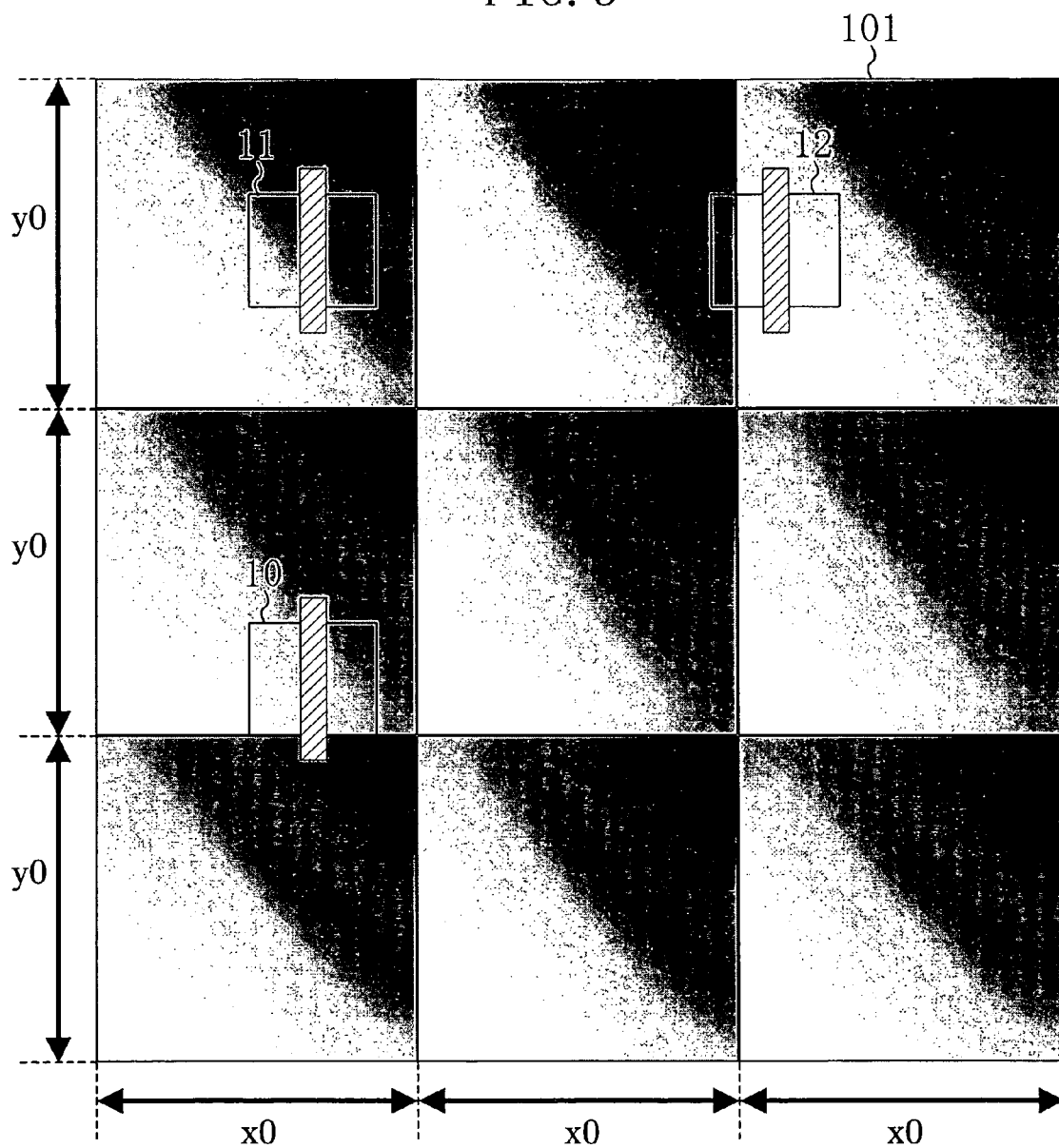
FIG. 3 is a layout chart illustrating a position topology in a semiconductor integrated circuit according to a fourth embodiment of the present invention.
Figure 4:
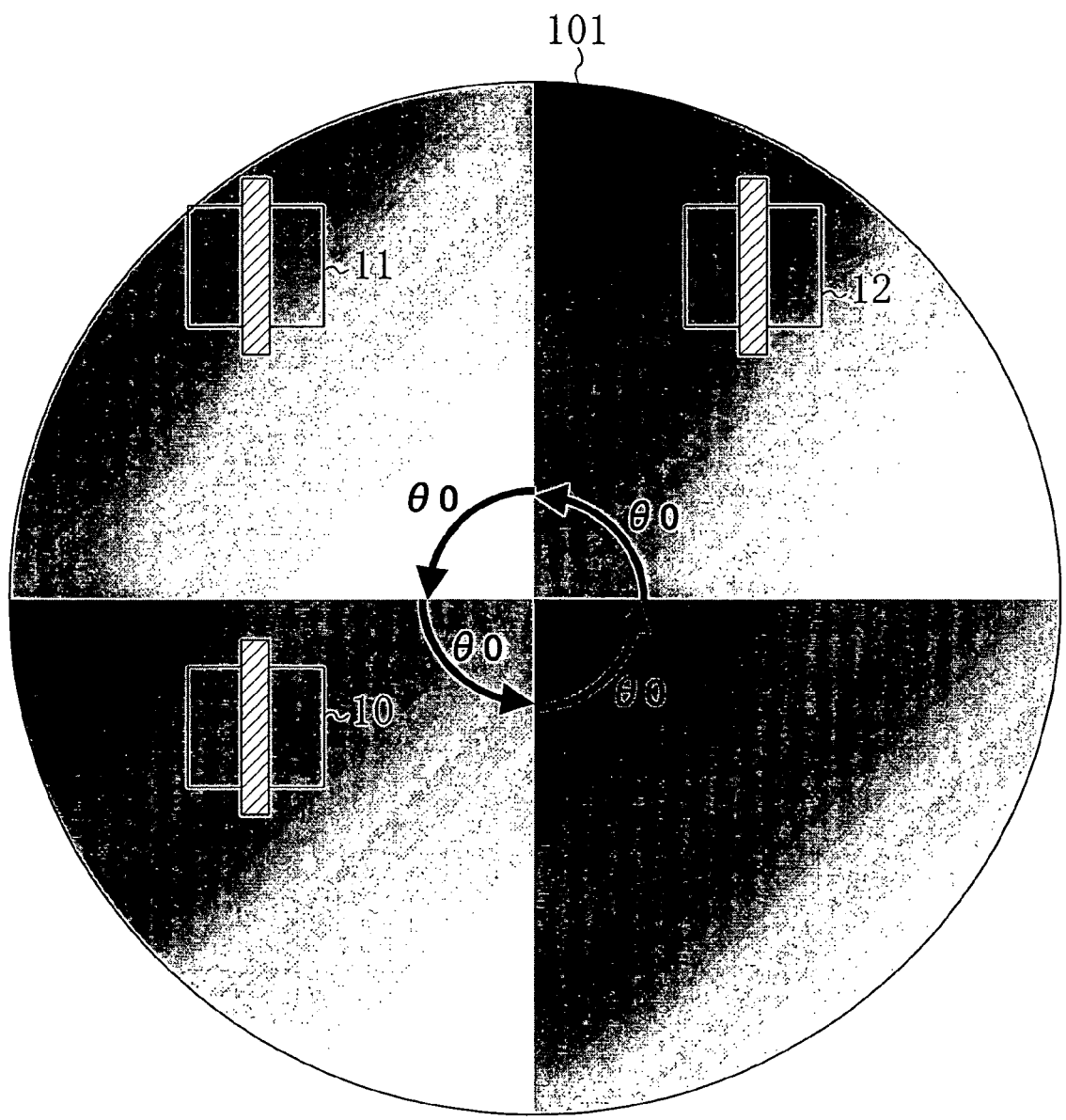
FIG. 4 is another layout chart illustrating a position topology in a semiconductor integrated circuit according to the fourth embodiment of the present invention.

FIG. 3 and FIG. 4 are layout charts illustrating position topologies in a semiconductor integrated circuit of the fourth embodiment of the present invention. In FIG. 3 and FIG. 4, a value of a position topology is larger in part with a darker color.

In this embodiment, position-dependent variation amount calculation when a position topology in a semiconductor integrated circuit exhibits periodicity will be described.

-Positional Coordinates-

In a positional coordinate system, as shown in FIG. 3, when a position topology exhibits periodicity in each partial layout has been divided by x0 in an x axis direction of a Cartesian coordinate system and y0 in a y axis direction of the Cartesian coordinate system, the position topology calculation equation of Equation 1 can be expressed by the following Equation 24. In this case, it is assumed that a remainder of s when s is divided by t is expressed by s mod t.

$$Z = a(x \bmod x0) + b(y \bmod y0) + c \quad \text{[Equation 24]}$$

In the position topology calculation step S211 of FIG. 2, a position topology of each element is calculated using Equation 24. A subsequent method for calculating a position-dependent variation amount is the same as that of the above-described embodiments. Therefore, the description thereof will be omitted.

-Rotational Coordinates-

In a rotational coordinate system, as shown in FIG. 4, when a position topology exhibits periodicity in each partial layout divided by a rotation angle of $\theta 0$ of a polar coordinate system, the position topology calculation equation of Equation 3 can be expressed by the following Equation 25.

$$Z = d\, r \cos((\theta \bmod \theta 0) - e) \quad \text{[Equation 25]}$$

In the position topology calculation step S211 of FIG. 2, a position topology of each element is calculated using Equation 25. A subsequent method for calculating a position-dependent variation amount is the same as that of the above-described embodiments. Therefore, the description thereof will be omitted.

In this embodiment, the values x0, y0 and $\theta 0$ in FIG. 3 and FIG. 4 indicating periodicities of position topologies may be arbitrarily designated by a designer of a semiconductor integrated circuit or may be automatically generated by a calculator using random numbers and the like.

Furthermore, in ion implantation, light exposure, polishing, cleansing, deposition or some other fabrication process step for fabricating a semiconductor integrated circuit, based on process information including a region, a rotation angle and the like for the process step, a shape of each partial layout, periodic conditions for periodicity and the like can be determined. As the process information, "information that an arbitrary fabrication process step is repeated for each part of a wafer or a chip", "information that the same process step, e.g., rotation injection and the like is performed from a plurality of different directions" and the like are given.

In addition, periodic conditions and the like can be determined by using actual measured values obtained from various measurements performed to a fabricated semiconductor integrated circuit.

Therefore, in this embodiment, the position-dependent variation amounts can be effectively estimated by defining periodicities of position-dependent variation amounts of an element, an interconnect and the like in a semiconductor integrated circuit, based on information for fabrication process steps for fabricating a semiconductor integrated circuit and actually measured information.

Fifth Embodiment

A position-dependent variation amount computation method according to a fifth embodiment of the present invention will be described.

In this embodiment, fabrication process information is reflected in calculation of the position-dependent variation amount information 204.

Specifically, fabrication process information for ion implantation, light exposure, polishing, cleansing, deposition and like process step, fabrication process information obtained when a semiconductor integrated circuit is actually measured, even though the cause and effect relationship for characteristic change is unknown, and like process information can be used. The fabrication process information includes: "the direction in which processing in fabrication process is performed, e.g., an injection direction when an injection process step is performed"; "a characteristic parameter and a shape parameter variable depending on a distance from a center point where processing such as an injection process step and the like is performed"; "distributions of a characteristic parameter and a shape parameter variable in the periphery of a chip and the like"; and "an arbitrary distribution function according to actual measurements".

Therefore, according to this embodiment, based on information for fabrication process steps and actually measured information, a position-dependent variation amount variable depending on an arrangement position of each element or interconnect constituting a semiconductor integrated circuit can be estimated.

<Circuit Analysis Method>

Sixth Embodiment

A circuit analysis method according to a sixth embodiment of the present invention will be described.

Figure 5:
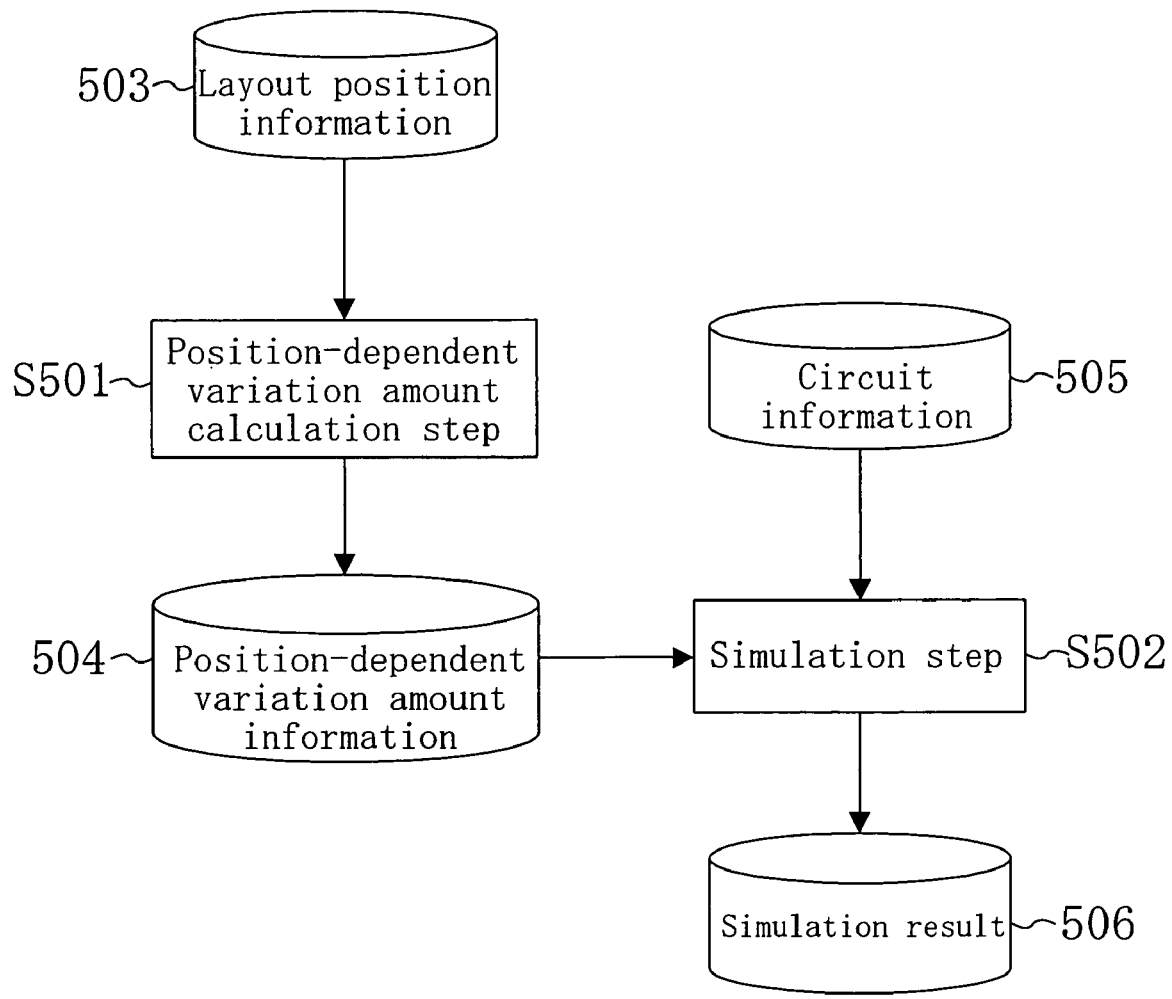
FIG. 5 is a flowchart of circuit analysis processing according to a sixth embodiment of the present invention.

FIG. 5 is a flowchart of circuit analysis processing according to a sixth embodiment of the present invention.

As shown in FIG. 5, in a position-dependent variation amount calculation step S501, using layout position information 503 as an input, position-dependent variation amount information 504 which is a variation amount for a characteristic parameter or a shape parameter variable depending on an arrangement position of each element constituting a design target semiconductor integrated circuit is calculated. The position-dependent variation amount information 504 includes a position-dependent variation amount of a shape parameter or a characteristic parameter necessary for circuit analysis of the semiconductor integrated circuit.

In this case, it is assumed that using the above-described position-dependent variation amount computation method, as the position-dependent variation amount information 504, $\Delta W11=0.328$ and $\Delta W12=0.356$ are obtained for gate width dimension differences $\Delta W11$ and $\Delta W12$ of the transistors 11 and 12 and $\Delta Vt11=0.10$ and $\Delta Vt12=0.12$ are obtained for threshold voltage reduction amounts $\Delta Vt11$ and $\Delta Vt12$.

In a simulation step S502, a simulation is performed for circuit information 505. In performing the simulation, of the circuit information 505, respective gate widths W11 and W12 of the transistors 11 and 12 and a threshold voltage Vt are corrected according to the values of the position-dependent variation amounts $\Delta W11$, $\Delta W12$, $\Delta Vt11$ and $\Delta Vt12$ and a simulation is performed. Thus, simulation results 506 are obtained.

Specifically, when in the circuit information 505, for the transistors 11 and 12, W=3.0 holds for the gate width W and Vt=0.70 holds for the threshold voltage Vt, values obtained from calculations of the following Equations 26 through 29 are used for the gate widths W11 and W12 and the threshold voltages Vt11 and Vt12 in the simulation step S502.

$$W11 = W - \Delta W11 = 3.0 - 0.328 = 2.672 \quad \text{[Equation 26]}$$

$$W12 = W - \Delta W12 = 3.0 - 0.356 = 2.644 \quad \text{[Equation 27]}$$

$$Vt11 = Vt - \Delta Vt11 = 0.70 - 0.10 = 0.60 \quad \text{[Equation 28]}$$

$$Vt12 = Vt - \Delta Vt12 = 0.70 - 0.12 = 0.58 \quad \text{[Equation 29]}$$

Values obtained from calculations of Equations 26 through 29 are shape parameters and character parameters obtained under consideration of their position-dependent variation amounts. By performing a simulation using these values, circuit analysis reflecting variation amounts variable depending on an arrangement position of each element constituting a semiconductor integrated circuit becomes possible.

In this embodiment, when a position-dependent variable amount is predictable, a simulation may be performed using a predetermined, predicted value. Moreover, needless to say, a position-dependent variation amount may be calculated by some other position-dependent variation amount computation method than the above-described method and a simulation may be performed using resultant values of the calculation.

Seventh Embodiment

A circuit analysis method according to a seventh embodiment of the present invention will be described.

In this embodiment, a circuit analysis method used when process variations of an element constituting a semiconductor integrated circuit include a component dependent on an arrangement position of the element and a component independent on the arrangement position will be described.

In this case, it is assumed that a center value of process variations of a gate width dimension difference $\Delta W$ for a gate width W of a transistor is a component dependent on an arrangement position of the transistor, the center value is calculated according to Equation 4 and Equation 7, a standard deviation of process variations of the gate width W of the transistor is a component independent on the arrangement position, and the standard deviation is calculated to be 0.1.

Figure 6:
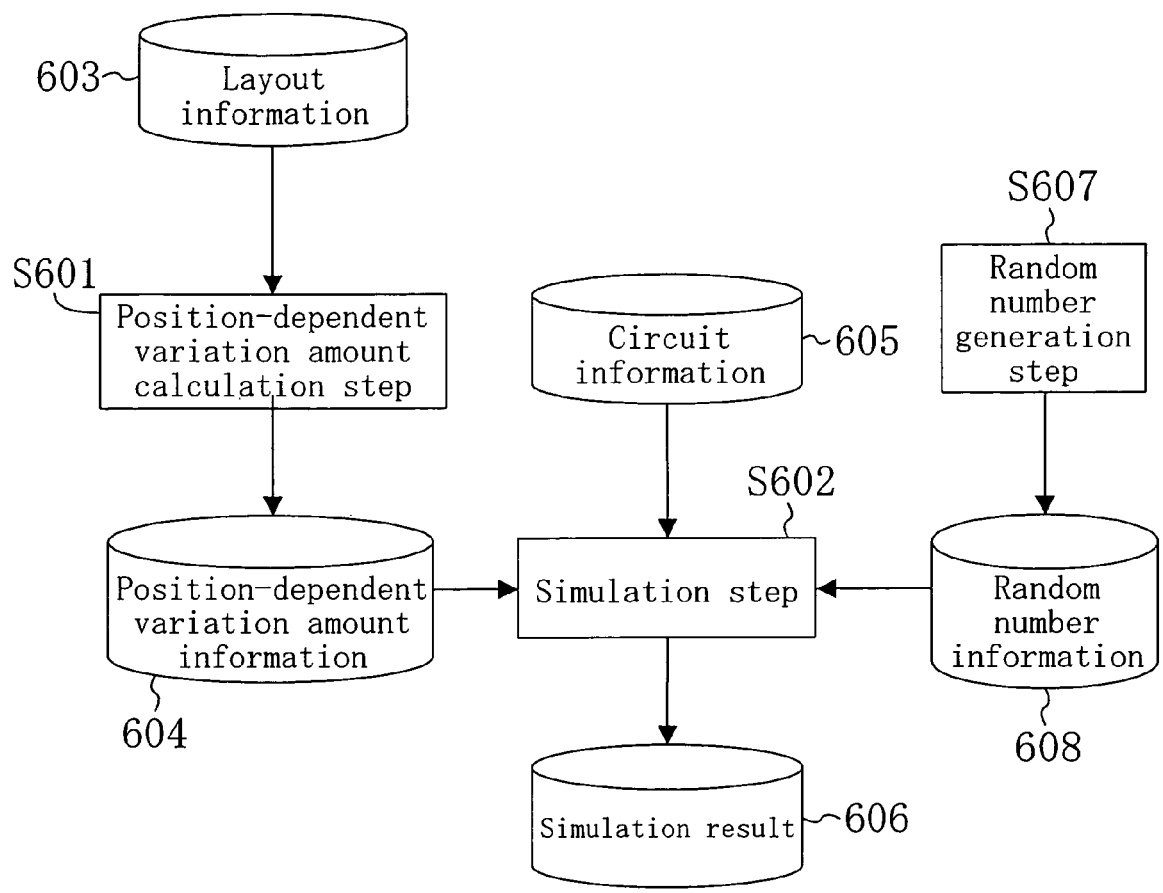
FIG. 6 is a flowchart of circuit analysis processing according to each of seventh and eighth embodiments of the present invention.

FIG. 6 is a flowchart of circuit analysis processing according to a seventh embodiment of the present invention.

As shown in FIG. 6, in a position-dependent variation amount calculation step S601, using layout information 603 as an input, calculations are performed according to Equation 26 and Equation 27 to obtain a position-dependent variation amount information 604. In this embodiment, the position-dependent variation amount information 604 includes center values W11 and W12 of process variations for the respective gate widths of the transistors 11 and 12.

Thereafter, in a simulation step S602, a simulation is performed for circuit information 605. In this simulation, random number information 608 including a random number group for the gate width of the transistor 11 having distribution characteristics with a mean of 2.672 and a standard deviation of 0.1 and a random number group for the gate width of the transistor 12 having distribution characteristics with a mean of 2.644 and a standard deviation of 0.1 is generated in a random number generation step S607 and the Monte Carlo simulation is performed using the random number information 608.

In the circuit analysis method of this embodiment, the Monte Carlo simulation under consideration of a component dependent on an arrangement position of an element constituting a design target semiconductor integrated circuit and a random component independent on the arrangement position can be preformed.

Eighth Embodiment

A circuit analysis method according to an eighth embodiment of the present invention will be described.

In this embodiment, it is assumed that a worst case for position-dependent characteristics for a center of process variations of an element constituting a semiconductor integrated circuit. A circuit analysis method used when the process variations of the element includes a component dependent on an arrangement position of the element and a component independent on the arrangement position will be described.

In this case, it is assumed that a variation amount for each of the gate width dimension differences $\Delta W11$ and $\Delta W12$ for gate widths W of the two transistors 11 and 12 of FIG. 1 is constant but the centers W11 and W12 of variations are changed depending on positions of the transistors. A maximum value of a difference between the centers W11 and W12 of variations of the gate widths W for the two transistors 11 and 12 is expressed by the following Equation 30 where x is a distance between the two transistors. Assume that the standard deviation of the variations for both cases is 0.1.

$$W11-W12=0.01x \quad \text{[Equation 30]}$$

In this case, position topology calculation equations for the gate width dimension differences $\Delta W11$ and $\Delta W12$ for the transistors 11 and 12 are expressed by Equation 18 and Equation 19, thereby showing the position dependency of process variations. According to Equation 23, when e=0 or e=π holds, the difference $\Delta W11-\Delta W12$ between the gate width dimension differences $\Delta W11$ and $\Delta W12$ is maximum. Thus, in this case, circuit analysis is performed with e=0 whereby the case where a distance between the centers W11 and W12 of the variations for the transistors 11 and 12 is the largest is a worst case.

As shown in FIG. 6, in the position-dependent variation amount calculation step S601, using the layout information 603 as an input, calculations are performed according to Equations 31 through 37 to obtain the position-dependent variation amount information 604. In this case, the position-dependent variation amount information 604 includes the gate width dimension differences $\Delta W11$ and $\Delta W12$ for the transistors 11 and 12 and the centers W11 and W12 of the variations of the gate widths.

$$Z=r\cos(\theta) \quad \text{[Equation 31]}$$

$$Z11=4\cos(\pi/2)=0.0 \quad \text{[Equation 32]}$$

$$Z12=5.6\cos(\pi/4)=4.0 \quad \text{[Equation 33]}$$

$$\Delta W11=0.3+0.01Z11=0.3+0.01\cdot(0.0)=0.3 \quad \text{[Equation 34]}$$

$$\Delta W12=0.3+0.01Z12=0.3+0.01\cdot(4.0)=0.34 \quad \text{[Equation 35]}$$

$$W11=W-\Delta W11=3.0-0.3=2.70 \quad \text{[Equation 36]}$$

$$W12=W-\Delta W12=3.0-0.34=2.66 \quad \text{[Equation 37]}$$

Thereafter, in the simulation step S602, a simulation is performed for the circuit information 605. In this simulation, the random number information 608 including a random number group for the gate width of the transistor 11 having a distribution with a mean of 2.70 and a standard deviation of 0.1 and a random number group for the gate width of the transistor 12 having distribution with a mean of 2.66 and a standard deviation of 0.1 is generated in the random number generation step S607 and the Monte Carlo simulation is performed using the random number information 608.

In the circuit analysis method of this embodiment, the Monte Carlo simulation under consideration of a component dependent on arrangement positions of a plurality of elements constituting a design target semiconductor integrated circuit and a random component independent on the arrangement positions can be preformed.

Ninth Embodiment

A circuit analysis method according to a ninth embodiment of the present invention will be described.

In this embodiment, circuit analysis is performed in the same manner as in the eight embodiment not only in a worst case for circuit characteristics provided by Equation 18 and Equation 19, i.e., when e=0 held, but also when a value for e is varied in the range of $0 \leq e \leq 2\pi$.

Figure 7:
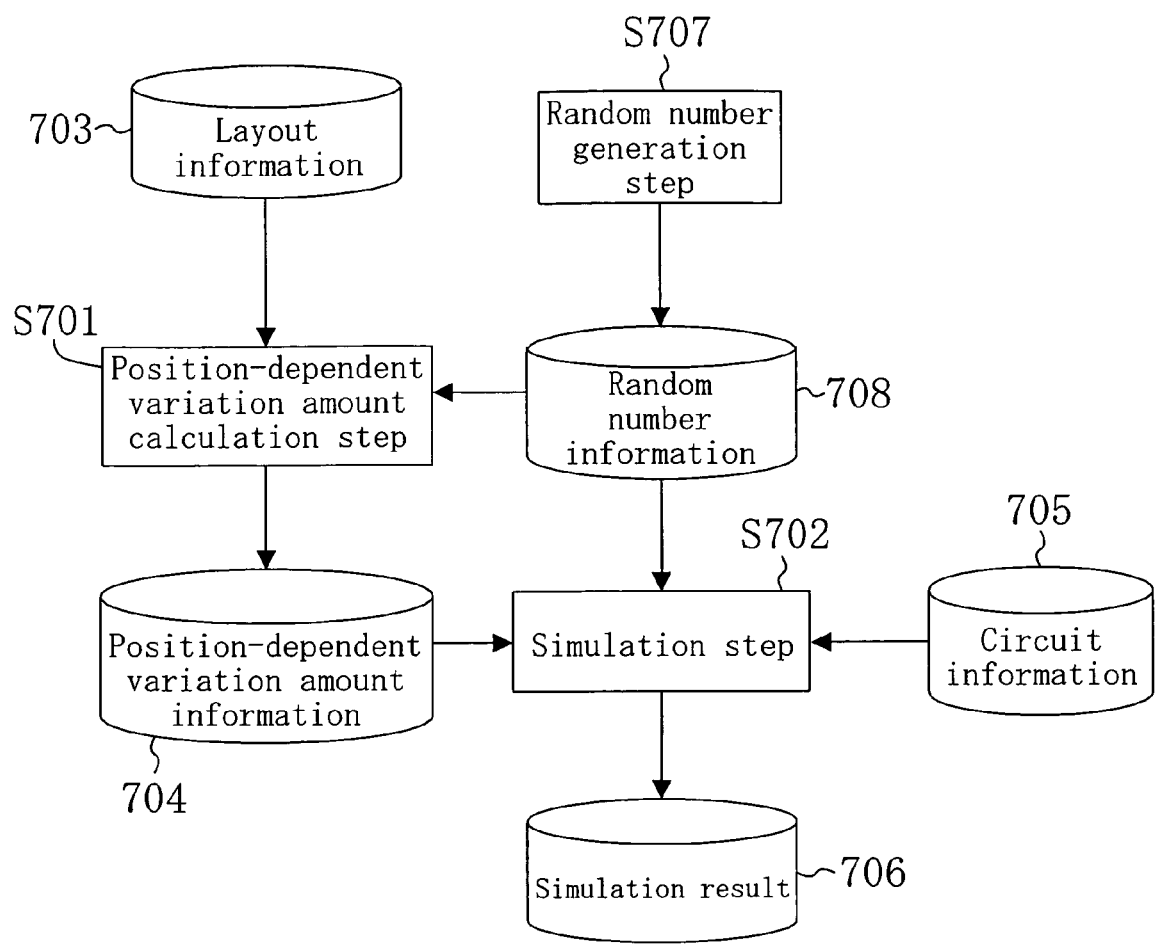
FIG. 7 is a flowchart of circuit analysis processing according to a ninth embodiment of the present invention.

FIG. 7 is a flowchart of circuit analysis processing according to a ninth embodiment of the present invention.

As shown in FIG. 7, in a position-dependent variation amount calculation step S701, using layout position information 703 as an input, calculations for position-dependent variation amount information 704 are performed according to Equation 20, Equation 21, Equation 38 and Equation 39. In this case, the position-dependent variation amount information 704 includes the gate width dimension differences $\Delta W11$ and $\Delta W12$ of the transistors 11 and 12 and the centers W11 and W12 of variations for gate widths of the transistors 11 and 12. In calculations for the gate width dimension differences $\Delta W11$ and $\Delta W12$, the value for e, which is changed in the range of $0 \leq e \leq 2\pi$, is given by random number information 708 generated in a random number generation step S707.

$$W11=W-\Delta W11=2.7-0.04\cos(\pi/2-e) \quad \text{[Equation 38]}$$

$$W12=W-\Delta W12=2.7-0.056\cos(\pi/4-e) \quad \text{[Equation 39]}$$

Thereafter, in a simulation step S702, a simulation is performed, based on circuit information 705. In this simulation, the random number information 608 including a random number group for the gate width of the transistor 11 having a distribution with a mean of 2.74 and a standard deviation of 0.1 and a random number group for the gate width of the transistor 12 having distribution with a mean of 2.70 and a standard deviation of 0.1 is generated in the random number generation step S607 and the Monte Carlo simulation is performed using the random number information 608.

In this case, for example, when the value for e in Equation 38 and Equation 39 is changed to $\{0, \pi/2, \pi, 3\pi/2\}$, $\Delta W11 = \{0, -0.04, 0, 0.04\}$ and $\Delta W12 = \{0, 0.04, -0.04, -0.04\}$ hold for the gate width dimension differences $\Delta W11$ and $\Delta W12$. Thus, $W11 = \{2.7, 2.74, 2.7, 2.66\}$ and $W12 = \{2.66, 2.66, 2.74, 2.74\}$ are obtained.

In the circuit analysis method of this embodiment, the Monte Carlo simulation under consideration of a component variable depending on positions of a plurality of elements and a random component independent on the positions can be performed.

What is claimed is:

1. A position-dependent variation amount computation method used when a characteristic parameter or a shape parameter of each element constituting a design target semiconductor integrated circuit is estimated using computer wherein the method comprises:
    a position topology calculation step for calculating a position topology of an element to be calculated; and
    a position topology dependent variation calculation step for calculating, based on the position topology, a position-dependent variation amount of the element,
    wherein on-wafer or on-chip layout position information for the element of the semiconductor integrated circuit is received and then, based on the layout position information for the element, a position-dependent variation amount variable depending on an arrangement position of the element is calculated to estimate the characteristic parameter or the shape parameter of the element,
    wherein a simulation for the semiconductor integrated circuit is performed by using a computer and using the position-dependent variation amount of the element of the semiconductor integrated circuit calculated according to the position-dependent variation amount computation method,
    wherein in the position topology calculation step, the position topology is calculated using a position topology calculation equation set, based on fabrication process information for the semiconductor integrated circuit, and
    wherein the position topology calculation equation is determined according to any one of an ion injection direction, a light exposure direction, a polishing direction, a cleansing direction and a deposition direction in fabrication process.

2. The position-dependent variation amount computation method of claim 1, wherein the element is an interconnect, a device or a partial circuit.

3. The position-dependent variation amount computation method of claim 1, wherein the arrangement position of the element is expressed by coordinates of a predetermined coordinate system.

4. The position-dependent variation amount computation method of claim 3, wherein an origin and a direction of a coordinate axis in the predetermined coordinate system are determined, based on a random number.

5. The position-dependent variation amount computation method of claim 1, wherein a computation position of the position-dependent variation amount is expressed by coordinates of a predetermined coordinate system.

6. The position-dependent variation amount computation method of claim 1, wherein in the position topology calculation step, the position topology is calculated using a predetermined position topology calculation equation.

7. The position-dependent variation amount computation method of claim 1, wherein in the position topology calculation step, the position topology is calculated using a position topology calculation equation providing a worst case for a circuit characteristic of the design target semiconductor integrated circuit.

8. The position-dependent variation amount computation method of claim 1, wherein in the position topology calculation step, the position topology is calculated, based on a random number.

9. The position-dependent variation amount computation method of claim 1, wherein the position-dependent variation amount is calculated, based on a position topology variable depending on an arrangement position of the element, and
    the position topology exhibits periodicity in each partial layout of the semiconductor integrated circuit.

10. The position-dependent variation amount computation method of claim 9, wherein the periodicity of the partial layout is repeated in a coordinate axis direction of a Cartesian coordinate system.

11. The position-dependent variation amount computation method of claim 9, wherein the periodicity of the partial layout is repeated in a rotation direction of a polar coordinate system.

12. The position-dependent variation amount computation method of claim 9, wherein a shape of the partial layout and a periodic condition for the periodicity are determined, based on fabrication process information.

13. The position-dependent variation amount computation method of claim 12, wherein the shape of the partial layout and the periodic condition for the periodicity are determined according to any one of an ion injection region, a light exposure region, a polishing region, a cleansing region and a deposition region in the fabrication process.

14. The position-dependent variation amount computation method of claim 12, wherein the fabrication process information is a rotation angle in a predetermined process step in the fabrication process.

15. The position-dependent variation amount computation method of claim 14, wherein the rotation angle in the predetermined process step is a rotation angle in any one of an ion injection step, a light exposure step, a polishing step, a cleansing step, and a deposition step in the fabrication process.

16. The position-dependent variation amount computation method of claim 1, wherein the position-dependent variation amount is a variation amount of the characteristic parameter or the shape parameter of the element due to a process variation.

17. The position-dependent variation amount computation method of claim 1, wherein the position-dependent variation amount is a mean value of a distribution function for a process variation.

18. The position-dependent variation amount computation method of claim 1, wherein the element is an interconnect, a device or a partial circuit, and
    the position-dependent variation amount is a variation amount of any one of respective shape parameters for the device and the interconnect and respective characteristic parameters for a threshold voltage, an oxide film thickness, a resistance value and a capacitance value of the device.

19. The position-dependent variation amount computation method of claim 1, wherein the position-dependent variation amount is calculated, based on a position topology variable depending on an arrangement position of the element.

20. The position-dependent variation amount computation method of claim 19, wherein the position-dependent variation amount is calculated according to a predetermined position-dependent variation amount equation.

21. The circuit analysis method of claim 1, wherein the simulation for the semiconductor integrated circuit is performed using a random number.

* * * * *